United States Patent [19]
Reiter

[11] 3,978,283
[45] Aug. 31, 1976

[54] SWITCHING ARRANGEMENT FOR RECEIVING DC SIGNALS

[75] Inventor: Herbert Reiter, Munich, Germany

[73] Assignee: Siemens Aktiengesellschaft, Munich, Germany

[22] Filed: Sept. 15, 1975

[21] Appl. No.: 613,638

Related U.S. Application Data

[63] Continuation of Ser. No. 529,495, Dec. 4, 1974, abandoned.

[30] Foreign Application Priority Data

Dec. 4, 1973   Germany............................ 2360376

[52] U.S. Cl................................ 178/69 A; 328/164
[51] Int. Cl.²................... H04L 25/06; H03K 5/153
[58] Field of Search .......... 178/69 A; 328/115, 162, 328/150, 163, 164; 307/235 R, 235 A; 325/42

[56] References Cited
UNITED STATES PATENTS

| | | |
|---|---|---|
| 3,327,230 | 6/1967 | Konian................................. 328/164 |
| 3,497,723 | 2/1970 | Nelson................................. 328/162 |
| 3,588,712 | 6/1971 | Vozumi................................ 328/150 |

Primary Examiner—Thomas A. Robinson
Attorney, Agent, or Firm—Gerald L. Lett

[57] ABSTRACT

A circuit arrangement for facilitating reception of direct current signals in telegraph or data transmission systems is described. A threshold circuit is disposed in the receive line; the threshold circuit has two threshold values, one of which is close in current value to the cut-off of the signal element, and the other of which is close in current value to the signal level of a signal element. A timer is switched into the circuit by a signal provided over a logic circuit when a first threshold level is undershot in a descending signal transition and when a second threshold level is exceeded during an ascending signal transition. The timer emits a clock pulse to an output circuit, which has been primed by an input circuit, the operation of which are controlled by signals from the outputs of the threshold circuit.

1 Claim, 3 Drawing Figures

SWITCHING ARRANGEMENT FOR RECEIVING DC SIGNALS

This is a continuation of application Ser. No. 529,495, filed Dec. 4, 1974, now abandoned.

BACKGROUND OF THE INVENTION

The invention concerns a switching arrangement for receiving direct current signals in telegraphic or data transmission systems.

As is generally known, distortions occur during the transmission of DC signals, which hinder the reception of the individual signal elements making up such signals. As is well known, a transmission circuit comprises not only the transmission line proper, but also the sending and receiving circuits terminating the line at both ends. Thus, two distortion-causing influences can essentially be distinguished.

One type of distortion to which DC signals are subject is caused by the fact that each line has capacitive and resistive components. Charging and discharging or charging and recharging of the line takes place with every change in the signal element through interruption or polarity reversal of the line caused by the transmitter. The time constant of the resistance-capacitance (RC) network formed by the transmission circuit leads to rounding in varying degrees of the signal waveforms. This occurs primarily in the case of on/off keying.

A second type of distortion is caused by the influence of inductive elements where, most significantly, the influence of the inductances on the sending and/or receiving circuits cannot fully be removed. The result is that such a transmission circuit, including transmission line and receiving and/or sending circuit, constitutes an oscillatory configuration. This means that a change on the line, for example, one caused by interruption or a short-circuit polarity reversal produces oscillations that initially die out slowly. Since, as a rule, the receivers are to be polarity-independent, the subharmonies of such oscillations can also be interpreted if conventional keying is employed. This may produce the result that the received signals have a sequence of brief current pulses and no-current intervals after every signal-element shift.

Thus, both the first type of distortion, also called RC distortion, and the second type, also called RLC distortion, require additional correcting means at the receiving end. Heretofore, to avoid RC distortions, the threshold value was set such that undershooting or exceeding of a threshold value by a signal-element shift is relayed with mimimum distortion. However, since the influences causing the RC distortions may vary from line to line, it is often necessary to adjust the threshold for each individual line. Despite the fact that these circuits contain a vast number of elements, it is not always possible to distinguish pulses caused by disturbances from true signal elements. Heretofore, special circuits, such as a start-signal test circuit, were necessary to eliminate such distortions.

Influences caused by subharmonics can likewise be avoided by properly adjusting the threshold value in the receiver circuit, but the optimum adjustment of the threshold value with respect to the reception of signals distorted by RLC influences causes a deterioration with respect to the reception of signals distorted by RC influences.

It is, therefore, an object of the invention to provide a receiver circuit by which distorted received DC signals can be interpreted substantially without distortion, while avoiding the disadvantages mentioned hereinabove.

SUMMARY OF THE INVENTION

In accordance with the invention, the foregoing and other objects are achieved in that a threshold circuit disposed in the receive line is provided with two threshold values, the first of which lies close to the current value designating the cut-off level of a signal element and the second close to the current value designating the signal level of a signal element. A timer is provided which is switched into circuit by a signal provided over a logic circuit both in the case of a descending signal transition of an incoming signal element when the first threshold value of the first output is undershot, and in the case of an ascending signal transition of a signal element when the second threshold value at the second output of the threshold circuit is exceeded. When a selectable protection period expires, the logic circuit sends a clock pulse to an output circuit. The output circuit is primed over an input circuit controlled by the signals provided at both outputs of the threshold circuit.

The receive distortion is reduced to a minimum by means of such an arrangement for the reception of distorted DC signals. At the same time, interpretation errors that could be caused by brief pulses are ruled out, since the switching in of the primed output circuit is not carried into effect until after the expiration of a selectable protection period.

A further advantage resides in the fact that the invention can be used with the same advantages both in transmission systems with single-current operation and in those with double-current operation.

BRIEF DESCRIPTION OF THE DRAWINGS

The principles of the invention will be more readily understood by reference to the description of a preferred embodiment given hereinbelow in conjunction with the drawings which are briefly described immediately below.

DETAILED DESCRIPTION OF THE DRAWINGS

Figure 1:
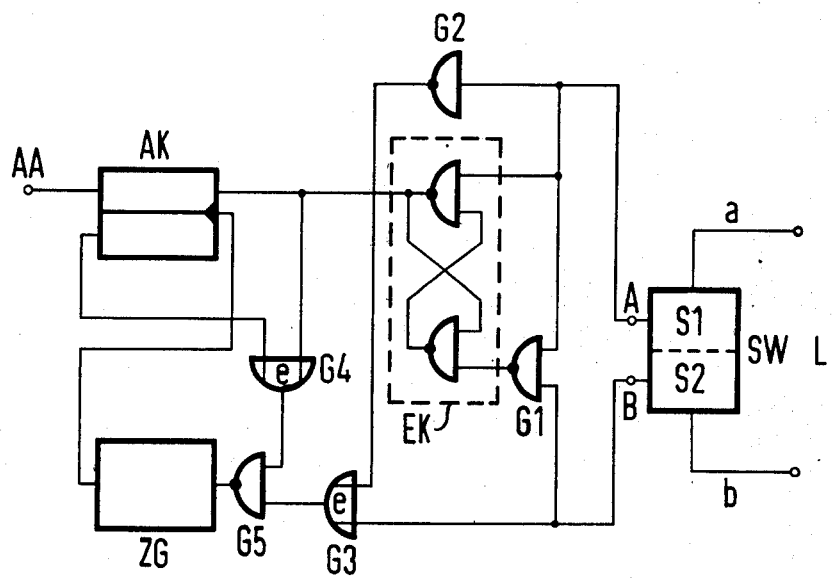
FIG. 1 is a schematic diagram of a preferred embodiment of a receive circuit constructed according to the invention.

The receive circuit illustrated in FIG. 1 contains a threshold circuit SW, to which are connected the two wires $a$ and $b$ of a receive line L. A first threshold value S1 and a second threshold value S2 are set in the threshold circuit. For purposes of description one starts from a single current, so that the first threshold value S1 can be considered as the upper threshold value and the second threshold value S2 as the lower threshold value. The outputs of the two threshold levels S1 and S2 of the threshold circuit Sw are labeled A and B. It is assumed that whenever the current flowing over the line L exceeds the threshold value, S1, a zero is provided at the output A. Likewise, a zero is provided at the output B of the threshold zone 2 whenever the current flowing over the line L exceeds the threshold value S2.

The outputs A and B of the threshold circuit SW are connected to an input flip-flop EK and to a logic circuit containing the gates G2, G3, G4 and G5. The receive circuit also has a timer ZG controlled via the logic element, and an output flip-flop AK, which is initialized via the input flip-flop EK and controlled by an output pulse of the timer ZG.

The input flip-flop initializes the output flip-flop AK whenever both outputs A and B of the threshold circuit SW provide corresponding output signals. The switching of the output flip-flop AK to the respective position corresponding to a signal element on the line occurs by means of the output pulse of the timer ZG generated upon the expiration of a selectable protection period. The timer ZG is started over the logic circuit in the case of a descending signal transition of an incoming signal element when the threshold value S1 is undershot and, in the case of an ascending signal transition of an incoming signal element when the threshold value S2 is exceeded.

To achieve the foregoing purpose, the logic circuit is provided with two exclusive OR gates G3 and G4 and with two NAND gates G2 and G5. By means of the first exclusive OR gate G3, the signals provided at the outputs A and B of the threshold circuit SW are interpreted, and by means of the second exclusive OR gate G4, the signals provided at the outputs of the output and input flip-flop AK and EK are interpreted. The outputs of the two gates G3 and G4 are interconnected in the gate G5 which, in turn, is connected to the input of the timer ZG. A state produced at the output of the gate G5 starts the timer ZG which, upon expiration of the selected protective period ts, switches the properly initialized output flip-flop AK, as a result of which the latter assumes a position corresponding to the polarity of the line. The timer ZG is set to its initial position with the switching of the output flip-flop AK.

To explain the mode of operation of the receive circuit, one starts from a stable condition that can be characterized by the fact that the current on the line lies above the two threshold values S1 and S2. In this case, the outputs A and B each provide a "zero". Thus, a "one" is provided over the output of the input flip-flop EK. A "one" is provided at the outputs of the two gates G3 and G4, so that the input of the timer ZG is not energized over the gate G5. If within a signal element a descending transition arrives on the line L, then the output A of the threshold circuit SW provides a "one" when the upper threshold value S1 is undershot, while, as before, a "zero" is available at the output B. The position of the input flip-flop EK is not changed thereby. However, a "zero" is presently provided over the gate G3, so that the timer ZG is started over the gate G5 in the form of a "one", where the protection period ts begins to run. If the current on the line L falls below the threshold value S2, a "one" will likewise be coupled to the output B. so that the input flip-flop EK is now switched and provides a "zero" to the output thereof, which reaches the output flip-flop AK as an initializing state. The output pulse provided by the timer ZG at the end of the protection period switches the output flip-flop AK to its new position, thereby setting the timer ZG to its initial position over the gate G4.

Interpretation errors and disturbances resulting from brief pulses are ruled out by the introduction of two threshold values, by the interconnection of the two signals provided at the outputs of the threshold circuit, and by the introduction of a selectable protection time.

Figure 2:
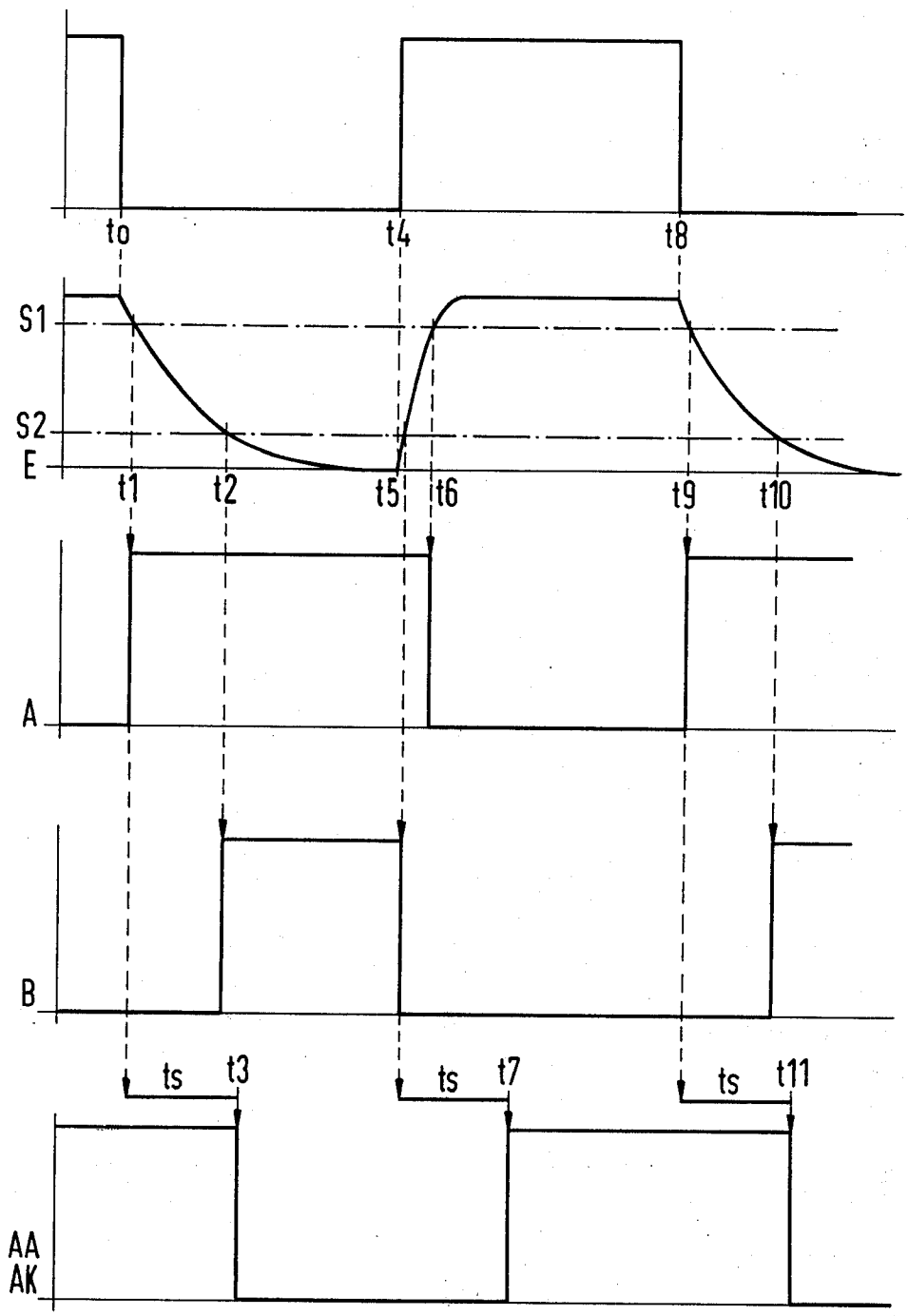
FIG. 2 is a time-waveform diagram illustrating the reception of a signal distorted by the capacitive influences of the line.

The advantages of the receive circuit constructed according to the invention will be more readily understood by reference to the FIGS. 2 and 3, wherein the invention will be explained with reference to the reception of single-current signals. On the top line FIG. 2 is shown an undistorted DC signal, the signal element shifts of which take place at the instants $t0$, $t4$ and $t8$. On the second line is shown the signal incoming at the input of the receive circuit and having its waveform rounded by RC influences of the line. On lines 3 and 4 are plotted the signals provided at the outputs A and B of the threshold circuit, while on line 5 is shown the position of the output flip-flop AK. Due to the time constant of the transmission circuit, upon the switching at the sending end from cut-off level to signal level, the current at the input of the receive circuit decreases only slowly. At the instant $t1$, the upper threshold S1 is undershot, thereby causing the output A to switch from 0 to 1, so that in the timer the protection time $ts$ starts to run. At the instant $t2$, the lower threshold value S is attained, so that presently a "one" is also provided at the output B, causing the input flip-flop EK to be switched. At the end of the protection time $ts$, the instant $t3$, the properly initialized output flip-flop AK is switched over the input flip-flop. Due to the selected logic conditions, the output flip-flop changes its position from 1 to 0, that is, it assumes the position corresponding to the received signal. If at the instant $t4$ a subsequent signal-element shift from signal level to cut-off level is emitted at the sending end, the current will start to rise again slowly, due to the time constant of the transmission current, but the signal transitions have diferent steepnesses by virtue of the different time constants for the charging and discharging of the line.

At the instant $t5$, the lower threshold value S2 is exceeded in the course of the rising signal transition, as a result of which a "zero" is again provided at the output B and, therewith, the protection time $ts$ starts to run again in the timer. At the instant $t6$, the current flowing through the line also exceeds the upper threshold value S1, so that a "zero" also appears at the output A, thereby switching the input flip-flop again. At the end of the protection time $ts$, at the instant $t7$, the output flip-flop AK is switched in accordance with the new state of the input flip-flop. It now assumes the new position corresponding to the state prevailing on the line. These processes are repeated in the manner described above at the instants $t8$, $t9$, $t10$ and $t11$.

Figure 3:
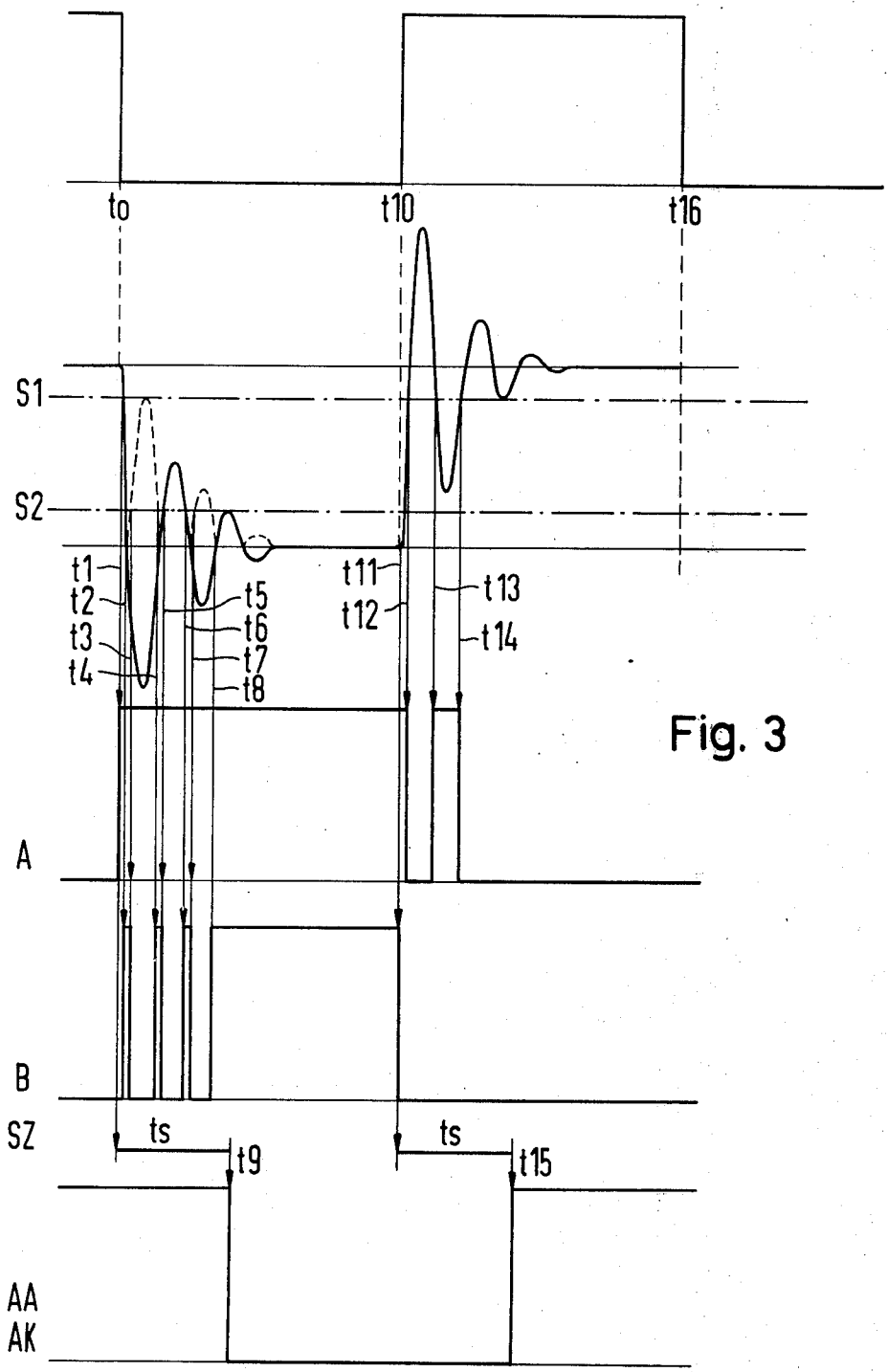
FIG. 3 is a time-waveform diagram illustrating the reception of a signal distorted by the inductive influences of a line.

The reception of the signals distorted by transients on the line occurs in similar fashion, for which reference is made to FIG. 3.

The first line of FIG. 3 again shows the undistorted signal, whose signal-element shifts take place at the instants $t0$, $t10$, and $t16$. In this case, disturbances manifest themselves in that a succession of oscillations follow each signal-element shift, whereby the subharmonics are shown in line 2 are likewise interpreted, due to the polarity-independence of the receiver. In the case of a descending signal transition, the threshold value S1 is reached at the instant $t1$, and, with that, the output A of the threshold circuit changes from 0 to 1. Due to the transients the lower threshold value is undershot at the instants $t2$, $t4$, $t6$ and $t8$, and exceeded at the instants $t3$, $t5$ and $t7$. Not until the instant $t8$ do the oscillations die out sufficiently so as not to exceed the lower threshold S2 any longer.

The protection time $ts$ in the timer has been started with the change of the output A from 0 to 1, and it now switches at the instant $t9$ the output flip-flop AK according to the initializing period provided by the input flip-flop manner described hereinabove. Oscillations reappear on the receiver with a new signal-element shift of the signal. However, whereas now the lower threshold value S2 is only exceeded once by the ascending signal transition at the instant $t11$, thereby changing the output signal at the output B from 1 to 0. the upper threshold value S1 is now repeatedly exceeded and undershot. This happens at the instants $t12$, $t13$ and $t14$. The protection time $ts$ was already started at the instant $t11$, with the change of the output signal at the output B from 1 to 0. At the instant $t12$, i.e., when the upper threshold value S1 is exceeded for the first time, the input flip-flop is switched. When the protection time $ts$ expires, the output flip-flop AK is as well switched to its new position.

The invention is described hereinabove in terms of a preferred embodiment constructed according to its principles. The described embodiment is only exemplary, and it is contemplated that it can be modified or changed in a variety of ways, while remaining within the scope of the invention, as defined by the appended claims.

What is claimed is:

1. A circuit arrangement for facilitating the undistorted reception of direct current signals comprising:

a receive line over which incoming message signals are received, threshold circuit means having first and second threshold values, said first threshold value being near the current value indicating the mark of a said message signal and said second value being near the current value indicating the space of a said message signal, said threshold circuit producing a pair of output signals having relative values indicating either the condition that said first threshold value has beed undershot during the descending transition of said message signal, or the condition that said second threshold value has been exceeded during an ascending transition of said message signal, input bistable circuit means coupled to said threshold circuit outputs, a change in state in said input bistable circuit means occurring only if the output signals of said threshold circuit are of equal value, logic circuit means for providing a first signal when said first threshold value is undershot during a descending transition of a said message signal and a second signal when said second threshold level is exceeded during an ascending transition of a said message signal, timing means switched in the circuit when said first or said second output signal is produced for emitting a clock pulse at the end of a predetermined period and output bistable circuit means which is set by an output signal of said input bistable circuit and reset by said clock pulse from said timing means.

* * * * *